United States Patent
Chuang et al.

(10) Patent No.: US 6,479,307 B2
(45) Date of Patent: Nov. 12, 2002

(54) METHOD OF MONITORING LOSS OF SILICON NITRIDE

(75) Inventors: Shu-Ya Chuang, Hsinchu Hsien (TW); Gow-Wei Sun, Taipei Hsien (TW); Ga-Ming Hong, Changhua Hsien (TW); Steven Chen, Kaoshiung (TW); Pei-Jen Wang, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/854,007

(22) Filed: May 10, 2001

(65) Prior Publication Data

US 2002/0127746 A1 Sep. 12, 2002

(30) Foreign Application Priority Data

Mar. 7, 2001 (TW) .................................. 90105284 A

(51) Int. Cl.[7] .......................... H01L 21/66; G01R 31/26
(52) U.S. Cl. .......................... 438/14; 438/16; 438/692; 438/719; 438/723; 438/743; 438/753; 438/758; 156/626; 156/646; 156/653; 156/657; 156/345
(58) Field of Search .......................... 438/14, 16, 7–9, 438/692, 719, 723, 743, 753, 758; 156/626, 646, 653, 651, 345

(56) References Cited

U.S. PATENT DOCUMENTS

| | | | | |
|---|---|---|---|---|
| 4,493,745 A | * | 1/1985 | Chen et al. ................... | 156/626 |
| 5,337,144 A | * | 8/1994 | Strul et al. .................... | 356/357 |
| 5,427,878 A | * | 6/1995 | Corliss .......................... | 430/30 |
| 5,788,869 A | * | 8/1998 | Dalton et al. ................. | 216/60 |
| 5,830,375 A | * | 11/1998 | Huang et al. ................. | 216/84 |
| 5,925,575 A | * | 7/1999 | Tao et al. ..................... | 438/692 |
| 6,046,796 A | * | 4/2000 | Markle et al. ................. | 356/72 |
| 6,074,959 A | * | 6/2000 | Wang et al. .................. | 438/738 |
| 6,193,900 B1 | * | 2/2001 | Baek et al. .................... | 216/85 |

* cited by examiner

Primary Examiner—Carl Whitehead, Jr.
Assistant Examiner—Kahanh Duong
(74) Attorney, Agent, or Firm—Charles C. H. Wu; Wu & Cheung, LLP

(57) ABSTRACT

A method of monitoring loss of silicon nitride, used to monitor the loss of a first etch stop layer below a first insulating layer in a first contact opening opening after the first contact opening is formed in the first insulating layer over a device region and scribe line of a wafer. A dummy wafer is provided on which stacks in sequence a second etch stop layer and a second insulating layer. The second insulating layer is patterned by removing a portion of the second insulating layer, so that a monitoring opening that exposes the second etch stop layer and a second contact opening are formed in the second insulating layer. A first measuring step is performed to measure a first thickness loss and a second thickness loss from the second etch stop layer exposed respectively by the monitoring opening and the second contact opening on the dummy wafer. And a correlation is established from the first and second thickness losses. A second measuring step is performed to measure a third thickness loss from the first etch stop layer exposed by the monitoring opening on the wafer. The result is then compared with the correlation to deduce a fourth thickness loss from the first contact opening on the wafer.

10 Claims, 3 Drawing Sheets

METHOD OF MONITORING LOSS OF SILICON NITRIDE

CROSS-REFERENCE TO RELATED APPLICATION

This application claims the priority benefit of Taiwan application serial no. 90105284, filed on Mar. 7, 2001.

BACKGROUND OF THE INVENTION

1. Field of the Invention

The invention relates in general to an on-line monitoring method. More particularly, this invention relates to a method of on-line monitoring the loss of silicon nitride.

2. Description of the Related Art

In the semiconductor fabrication process, how to reduce the fabrication cost and to enhance the device performance become on of the most important topics. To reduce the fabrication cost of the semiconductors, the number of devices fabricated on a wafer is increased. That is, the device integration on each wafer is increased. To increase the device integration, the dimension of devices has to be reduced. As a consequence, the dimensions of contact openings are reduced.

FIG. 1 shows a cross sectional view of a share contact opening. An isolation structure 102, a source/drain region 104 and a gate 106 are formed in a substrate 100. A silicon nitride spacer 108 is formed on both sidewalls of the gate 106. A dielectric layer 110 is then formed over the substrate 100. A share contact opening 112 is formed in the insulating layer 110 to expose a portion of the source/drain region 104 next to the gate 106 and a part of the spacer 108.

As the exposed part of the spacer 108 is easily corroded by the etchant used for forming the contact opening 112, the part of the spacer 108 is inevitably lost to result in the spacer 108a as shown in FIG. 1. The loss of the spacer 108 cause a leakage current between the isolation structure 102 formed under the gate 106 and adjacent to the source/drain region 104. As a consequence, the product electrical characteristics and yield are seriously affected.

An optical instrument is typically used to measure the loss of silicon nitride spacer. However, as the integration increases, the dimensions of the contact openings are often narrow to correctly measure the loss of silicon nitride spacer using the optical instrument.

SUMMARY OF THE INVENTION

The invention provides a method for monitoring loss of an etch stop layer on-line, applicable to monitor the loss of a first etch stop layer below a first insulating layer in a first contact opening after the first contact opening is formed in the first insulating layer over a device region and scribe line of a wafer. A dummy wafer is provided on which stacks in sequence a second etch stop layer and a second insulating layer. The second insulating layer is patterned by removing a portion of the second insulating layer, so that a monitoring opening that exposes the second etch stop layer and a second contact opening are formed in the second insulating layer. A first measuring step is performed to measure a first thickness loss and a second thickness loss from the second etch stop layer exposed respectively by the monitoring opening and the second contact opening on the dummy wafer. And a correlation is established from the first and second thickness losses. A second measuring step is performed to measure a third thickness loss from the first etch stop layer exposed by the monitoring opening on the wafer. The result is then compared with the correlation to deduce a fourth thickness loss from the first contact opening on the wafer.

Since the stack layers (comprising at least the second insulating layer and the second etch stop layer) formed on the dummy wafer are the same as those formed on the device wafer, the loss of second etch stop layer below the second insulating layer of the dummy wafer opening can easily be monitored on line after the monitoring opening and the second contact opening having the same pattern as the first contact opening are formed. A mathematical correlation is then established from the second thickness loss in the second contact opening and the first thickness loss in the first contact opening. A thickness loss from the first etch stop layer exposed by the monitoring opening on a scribe line of the device wafer is then monitored by an optical method, so as to deduce a thickness loss of the first insulating layer in the first contact opening over the device wafer. Therefore, the condition of the operation machine can be real time monitored and adjusted to ensure the product yield.

Both the foregoing general description and the following detailed description are exemplary and explanatory only and are not restrictive of the invention, as claimed.

DESCRIPTION OF THE PREFERRED EMBODIMENTS

Figure 2:
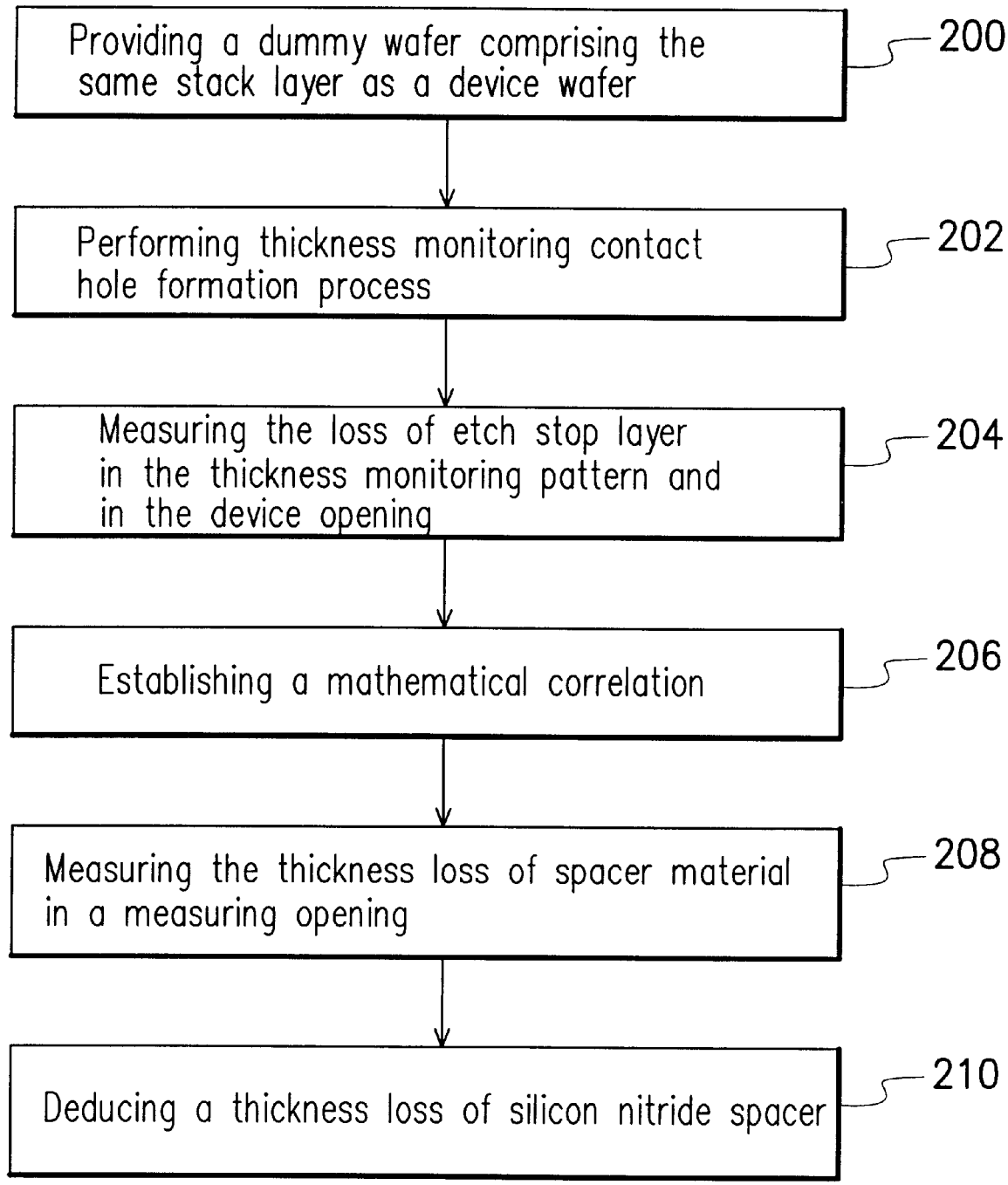
FIG. 2 shows a flow chart of on line monitoring the loss of silicon nitride according to the invention.
Figure 3:
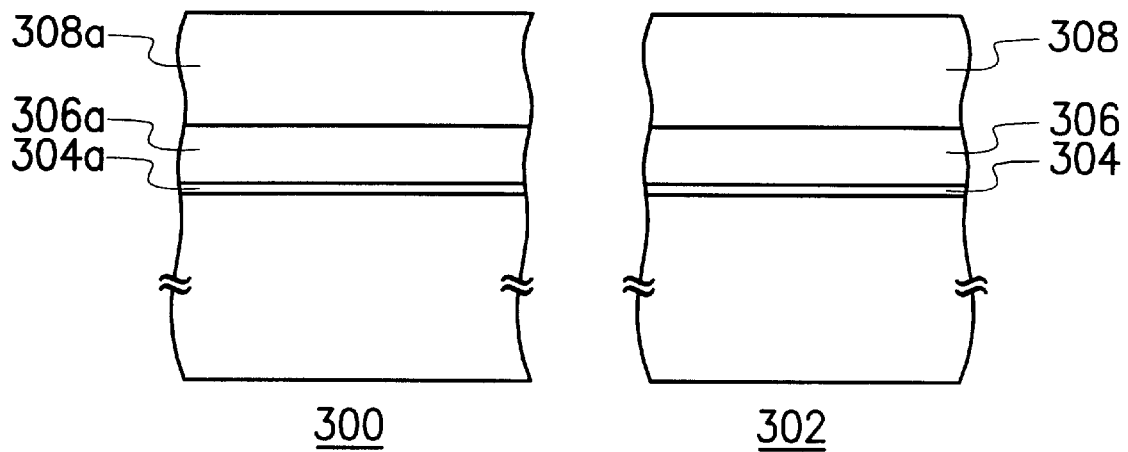
FIG. 3 shows a cross sectional view of a dummy wafer and a device wafer having identical stacked layers formed thereon.
Figure 3A:
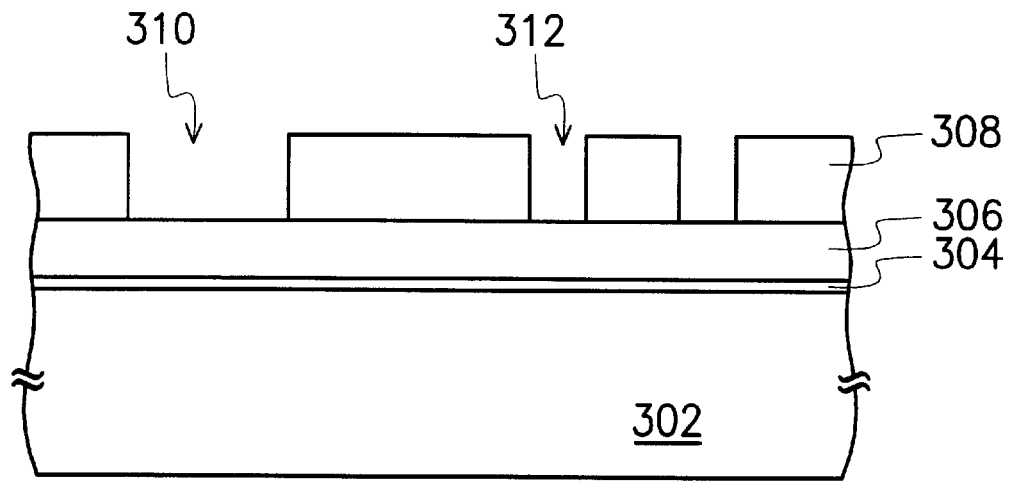
FIG. 3A shows a cross sectional view of a contact opening formed on the dummy wafer.

FIG. 2 shows a flow chart of the method to real time monitor the loss of silicon nitride according to the invention. FIG. 3 and FIG. 3A show cross sectional views of contact openings formed on a dummy wafer and a device wafer.

Figure 1:
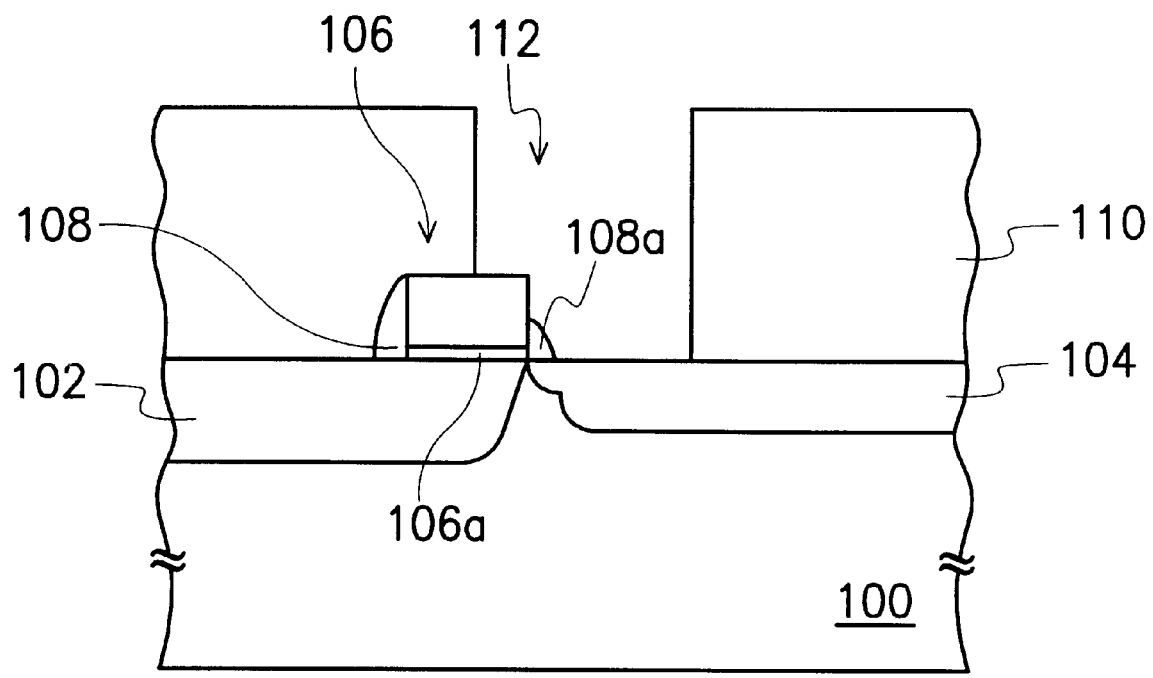
FIG. 1 shows a cross sectional view of a contact opening formed by conventional method.

"In FIG. 2, subsequent to the isolation structure 102, the source/drain region 104, the gate 106 (including the oxide layer 106a), the dielectric layer 110, and the partial contact opening 112 as shown in FIG. 1 are being formed on a device wafer 300, a dummy wafer 302 is provided. The dummy wafer 302 comprises the same stacked layers formed on the device wafer 300. For example, as shown in FIG. 3, a pad oxide layer 304, an etch stop layer 306 (the etch stop layer is made of the same material that is used for making the spacer of the device wafer), and an insulating layer 308 are formed in sequence on the dummy wafer 302. The etch stop layer 306 is thicker than an etch stop layer 306a formed on the device wafer 300, and the etch stop layer 306 has a thickness of about 1000 angstroms. The parameters for forming the etch stop layer 306 and the insulating layer 308 are [the] same as those for forming the etch stop layer 306a and an insulating layer 308a on the device wafer 300. Preferably, the etch stop layer 306 and the spacer are made of a same type of material, such as silicon nitride."

Figure 3B:
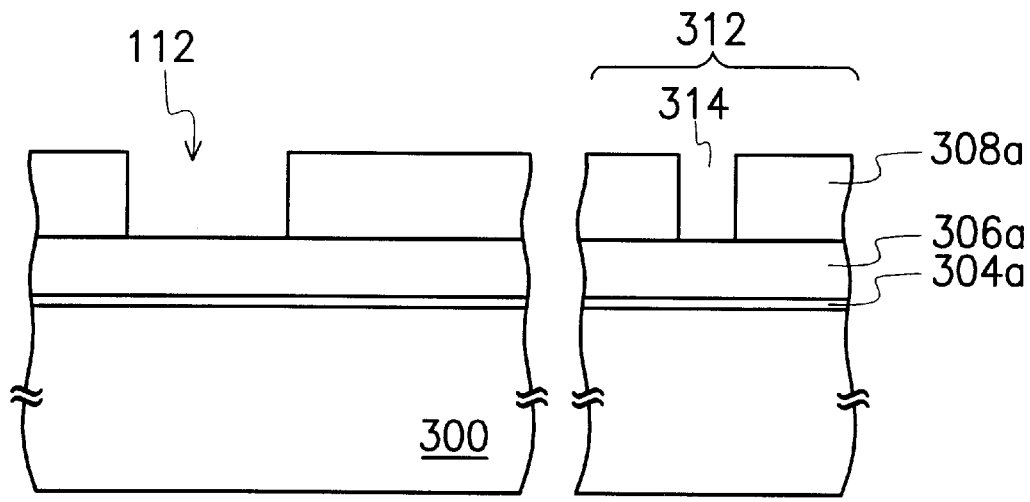
"FIG. 3B shows a cross sectional view of a partial contact window and measuring opening formed on a device wafer."

"Referring to both FIG. 2 and 3A, an etching step is performed to remove a portion of the insulating layer 308 on the dummy wafer 302, while a device opening 312 and a thickness monitor pattern 310 for exposing the etch stop layer 306 are formed in the insulating layer 308. The device opening 312 has the same pattern as that of the partial contact opening 112 as shown in FIG. 1 and 3B. The condition of the etching step is the same as that for forming the partial contact opening 112 as shown in FIG. 1."

Next, thickness losses from the etch stop layer 306 exposed by the thickness monitoring pattern 310 and the device opening 312 are measured respectively as described in step 204 in FIG. 2. The measuring step includes a cross-section analysis.

"The thickness loss of the etch stop layer 306 measured in the thickness monitoring pattern 310 and thickness loss of the etch stop layer 306 measured in the device opening 312 are used to establish a mathematical correlation as described in step 206 in FIG. 2."

"As shown in FIG. 3B, a thickness loss of the spacer material (not shown) in a measuring opening 314 on the scribe line 312 of the device wafer is measured as described in step 208 in FIG. 2. The measuring step includes an optical measuring method."

"Still referring to FIG. 3B, the thickness loss of the spacer material in the measuring opening 314 is then compared with the correlation obtained in step 206 to deduce a thickness loss of the spacer in the partial contact opening 112 as described in step 210 in FIG. 2."

"As described above, the stacked layers formed on the dummy wafer are the same as those formed on the device wafer, and the parameters for forming the thickness monitoring pattern are the same as those for forming the partial contact opening. Therefore, the invention provides an on line measurement of the losses of thickness of the etch stop layer below the insulating layer in the thickness monitoring pattern and the device opening after the thickness monitoring pattern and the device opening are formed. A mathematical correlation is established from the losses in thickness of the etch stop layer in the two openings. A loss of the thickness of the spacer material in the measuring opening on the scribe line is measured and compared with the correlation to deduce a loss of the etch stop layer or the spacer in a device contact opening and a partial contact opening in the device wafer. As the loss of the etch stop layer or the spacer can be precisely measured, the precise operation condition of the machine can be obtained. By adjusting the operation parameters of the machine, the product yield can be enhanced."

The above embodiment provides a method for measuring the loss of silicon nitride in a share contact opening. In addition to the loss of silicon nitride in a contact opening, the method can also be applied to measure loss of silicon nitride in other kinds of contact opening or via opening.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of an on line monitoring of a loss of an etch stop layer, applicable to monitor a loss of a first etch stop layer below a first insulating layer in a first contact opening after the first contact opening and a measuring opening are formed in the first insulating layer over a device region and a scribe line of a wafer, respectively, the method comprising:

providing a dummy wafer on which stacking in sequence a second etch stop layer and a second insulating layer, wherein parameters for forming the second etch stop layer and the second insulating layer are the same as those for forming the first etch stop layer and the first insulating layer on the wafer, and the second insulating layer has a same thickness as that of the first insulating layer;

patterning the second insulating layer so that a second contact opening and a thickness monitoring pattern for exposing the second etch stop layer are formed in the second insulating layer, wherein the second contact opening has a same pattern as that of the first contact opening;

performing a first measuring step for measuring respectively a first and second thickness losses of the second etch stop layer exposed by the thickness monitoring pattern and the second contact opening;

establishing a correlation from the first and second thickness losses; and performing a second measuring step for measuring a third thickness loss of the first etch stop layer exposed by the measuring opening, and comparing the third thickness loss with the correlation for deducing a fourth thickness loss of the first etch stop layer in the first contact opening.

2. The method according to claim 1, wherein the step of patterning the second insulating layer has the same parameter as that for forming the first contact opening.

3. The method according to claim 1, wherein the second etch stop layer is thicker than the first etch stop layer.

4. The method according to claim 1, wherein the first measuring step includes a cross-section analysis.

5. The method according to claim 1, wherein the second measuring step includes an optical measuring step.

6. The method according to claim 1, wherein the first etch stop layer and the second etch stop layer include a silicon nitride layer.

7. A method of measuring a loss of a spacer, applicable for monitoring the loss of the spacer after a partial contact opening and a measuring opening are formed in a dielectric layer formed over a device region and a scribe line, respectively, wherein the dielectric layer covers the spacer in the device region and the partial contact opening exposes a part of the spacer, the method comprising:

providing a dummy wafer on which stacking in sequence a first insulating layer and a second insulating layer, wherein parameters for forming the first and second insulating layers are the same as those for forming the spacer and the dielectric layer;

performing an etching step for removing a portion of the second insulating layer so that a device opening and a thickness monitoring pattern for exposing the first insulating layer are formed in the second insulating layer, wherein the device opening has a same pattern as that of the partial contact opening;

performing a cross-sectional analysis for measuring respectively a first thickness loss and a second thickness loss of the first insulating layer exposed by the thickness monitoring pattern and the device opening;

establishing a correlation from the first thickness loss and the second thickness loss; and performing an optical measuring step for measuring a third thickness loss of a spacer material layer exposed by the measuring opening, and comparing the third thickness loss with the correlation for deducing a fourth thickness loss of the spacer exposed by in the partial contact opening.

8. The method according to claim 7, wherein the etching step has the same parameters as those for forming the partial contact opening.

9. The method according to claim 7, wherein the first insulating layer is thicker than the spacer material layer.

10. The method according to claim 7, wherein the first insulating layer and the spacer material layer include a silicon nitride layer.

* * * * *